United States Patent
Li

(10) Patent No.: US 10,192,790 B2
(45) Date of Patent: Jan. 29, 2019

(54) SRAM DEVICES AND FABRICATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(*) Notice: Subject to any disclaimer, the term of this patent is extended or adjusted under 35 U.S.C. 154(b) by 0 days.

(21) Appl. No.: 15/826,043

(22) Filed: Nov. 29, 2017

(65) Prior Publication Data

US 2018/0151451 A1     May 31, 2018

(30) Foreign Application Priority Data

Nov. 30, 2016   (CN) .......................... 2016 1 1082508

(51) Int. Cl.
| | |
|---|---|
| H01L 27/00 | (2006.01) |
| H01L 21/8238 | (2006.01) |
| H01L 27/11 | (2006.01) |
| H01L 21/28 | (2006.01) |
| H01L 27/092 | (2006.01) |

(Continued)

(52) U.S. Cl.
CPC ............... *H01L 21/823842* (2013.01); *H01L 21/28088* (2013.01); *H01L 21/823821* (2013.01);
(Continued)

(58) Field of Classification Search
CPC ......................... H01L 27/11; H01L 2924/1437
See application file for complete search history.

(56) References Cited

U.S. PATENT DOCUMENTS 9,502,416 B1 * 11/2016 Kim .................... H01L 27/1116
2014/0042491 A1    2/2014 Chen et al.
(Continued)

OTHER PUBLICATIONS

The European Patent Office (EPO) The Extended European Search Report for 17204267.3 dated Apr. 3, 2018 8 Pages.

*Primary Examiner* — Ngan Ngo
(74) *Attorney, Agent, or Firm* — Anova Law Group, PLLC

(57) ABSTRACT

A method for fabricating an SRAM device includes providing a base substrate including a pull up transistor (PUT) region and a pull down transistor (PDT) region, forming a gate dielectric layer, forming a first work function (WF) layer using a P-type WF material, removing the first WF layer formed in the PDT region, forming a second WF layer using a P-type WF material on the first WF layer in the PUT region and on the gate dielectric layer in the PDT region, removing the second WF layer formed in the PDT region, forming a third WF layer using an N-type WF material on the top and the sidewall surfaces of the second WF layer in the PUT region, the sidewall surface of the first WF layer in the PUT region, and the gate dielectric layer in the PDT region, and forming a gate electrode layer on the third WF layer.

13 Claims, 6 Drawing Sheets

(51) Int. Cl.
*H01L 29/49* (2006.01)
*H01L 29/66* (2006.01)

(52) U.S. Cl.
CPC .......... *H01L 27/0924* (2013.01); *H01L 27/11* (2013.01); *H01L 27/1104* (2013.01); *H01L 29/4966* (2013.01); *H01L 29/66545* (2013.01); *H01L 2924/1437* (2013.01)

(56) References Cited

U.S. PATENT DOCUMENTS

| | | | |
|---|---|---|---|
| 2014/0061813 A1* | 3/2014 | Yu | H01L 27/1104 257/369 |
| 2014/0061814 A1* | 3/2014 | Kim | H01L 21/823857 257/369 |
| 2014/0077281 A1* | 3/2014 | Won | H01L 21/823842 257/288 |
| 2014/0113443 A1* | 4/2014 | Won | H01L 21/28185 438/591 |
| 2014/0363960 A1* | 12/2014 | Kim | H01L 21/82345 438/585 |
| 2015/0187763 A1* | 7/2015 | Kim | H01L 27/088 257/392 |
| 2016/0020118 A1 | 1/2016 | Park et al. | |
| 2016/0064225 A1* | 3/2016 | Kim | H01L 29/511 438/591 |
| 2016/0240630 A1* | 8/2016 | Seong | H01L 29/66545 |
| 2017/0229462 A1* | 8/2017 | Kim | H01L 21/823857 |
| 2017/0236821 A1* | 8/2017 | Kim | H01L 21/82345 257/401 |
| 2017/0365527 A1* | 12/2017 | Zhou | H01L 21/823842 |

\* cited by examiner

SRAM DEVICES AND FABRICATION METHODS THEREOF

CROSS-REFERENCES TO RELATED APPLICATIONS

This application claims the priority of Chinese Patent Application No. CN201611082508.6, filed on Nov. 30, 2016, the entire content of which is incorporated herein by reference.

FIELD OF THE DISCLOSURE

The present disclosure generally relates to the field of semiconductor fabrication technology and, more particularly, relates to static random-access memory (SRAM) devices and fabrication methods thereof.

BACKGROUND

In current semiconductor industry, integrated circuit (IC) products mainly include three types of devices: logic devices, memory devices, and analog circuits. Among these three types of devices, memory devices account for a large proportion of the IC products. With the development of semiconductor technology, in order to expand the application range of memory devices, it is necessary to simultaneously form memory devices together with other types of devices on a same chip to form an embedded semiconductor memory device. For example, to embed a memory device in a central processing unit (CPU), the memory device may need to be compatible with the embedded CPU platform, and the original specifications and the corresponding electrical performance of the memory device may need to be retained.

Usually, the memory device may need to be compatible with the embedded standard logic device. For an embedded semiconductor device, the device may often include a logic region and a storage region. The logic region may usually include a plurality of logic devices, the storage region may include a plurality of memory devices. With the development of memory technology, various types of semiconductor memories such as static random access memories (SRAMs), dynamic random access memories (DRAMs), erasable programmable read-only memories (EEPROMs), flash memories, etc. have emerged. Among the various types of semiconductor memories, SRAM devices demonstrate a number of advantages such as low energy-consumption, relatively-fast operation speed, etc. Therefore, SRAM devices and the corresponding fabrication methods have attracted more and more attention.

However, the electrical performance of conventional SRAM devices may still need to be improved. The disclosed SRAM devices and fabrication methods thereof are directed to solve one or more problems set forth above and other problems in the art.

BRIEF SUMMARY OF THE DISCLOSURE

One aspect of the present disclosure includes a method for fabricating an SRAM device. The method includes providing a base substrate including a pull up (PU) transistor region and a pull down (PD) transistor region adjacent to the PU transistor region, forming a gate dielectric layer on a portion of the base substrate in the PU transistor region and the PD transistor region, forming a first work function (WF) layer using a P-type WF material on the gate dielectric layer, removing a portion of the first WF layer formed in the PD transistor region, forming a second WF layer using a P-type WF material on a remaining portion of the first WF layer in the PU transistor region and on the gate dielectric layer in the PD transistor region, removing a portion of the second WF layer formed in the PD transistor region, forming a third WF layer using an N-type WF material on a top surface and a sidewall surface of a remaining portion of the second WF layer in the PU transistor region, a sidewall surface of the remaining portion of the first WF layer in the PU transistor region, and the gate dielectric layer in the PD transistor region, and forming a gate electrode layer on the third WF layer.

Another aspect of the present disclosure provides an SRAM device. The SRAM device includes a base substrate including a PU transistor region and a PD transistor region adjacent to the PU transistor region, a gate dielectric layer formed on a portion of the base substrate in the PU transistor region and the PD transistor region, a first WF layer formed on a portion of the gate dielectric layer in the PU transistor region and a second WF layer formed on the first WF layer in the PU transistor region, and a third WF layer formed on a top surface and a sidewall surface of the second WF layer in the PU transistor region, a sidewall surface of the first WF layer in the PU transistor region, and the gate dielectric layer in the PD transistor region. Each of the first WF layer and the second WF layer is made of a P-type WF material, and the third WF layer is made of an N-type WF material. The SRAM device also includes a gate electrode layer formed on the third WF layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
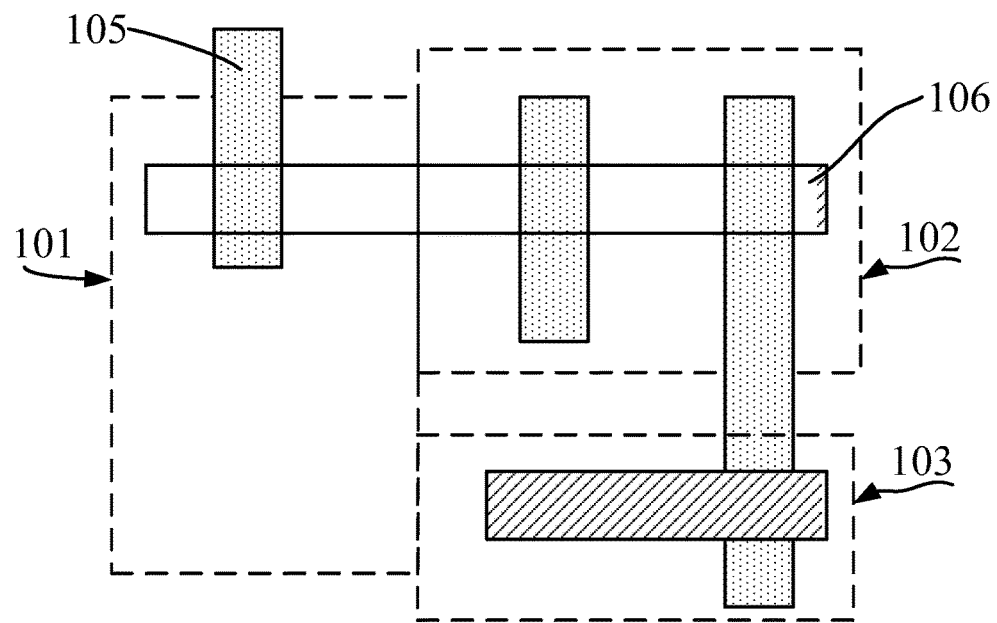
FIG. 1 illustrates a schematic top view of an SRAM device.

FIG. 1 shows a schematic top view of an SRAM device. The SRAM device includes a pull up (PU) transistor, two pull down (PD) transistors, and a pass gate (PG) transistor. The PU transistor is formed in a first region 101, the two PD transistors are formed in a second region 102, and the PG transistor is formed in a third region 103. Usually, the PU transistor is a P-type metal-oxide-semiconductor (PMOS) transistor, while the two PD transistors and the PG transistor are all N-type metal-oxide-semiconductor (NMOS) transistors.

For illustration purposes, the SRAM device is described to be a fin field-effect transistor (Fin-FET) device. The first region 101 and the second region 102 are adjacent to each other. In addition, a plurality of fin structures 105 are formed in the first region 101, the second region 102, and the third region 103. Specifically, the first region 101 includes one fin structure 105 and the second region 102 includes two fin structures 105. Moreover, the second region 102 and the third region 103 share a fin structure 105. That is, one of the two fin structures 105 formed in the second region 102 extends into the third region 103. Further, a gate electrode layer 106 is formed across each fin structure 105 in the first region 101, the second region 102, and the third region 103. Specifically, the first region 101 and the second region 102 share a gate electrode layer 106. As shown in FIG. 1, the shared gate electrode layer 106 is formed across the fin structure 105 in the first region 101 and also across each of the two fin structures 105 formed in the second region 101. In addition, another gate electrode layer 106 is formed across the fin structure 105 in the third region 103.

The PU transistor is a PMOS device, and the two PD transistors are both NMOS devices. In order to meet the requirements to improve the threshold voltages of both the PMOS device and the NMOS device, different metal materials are usually used to respectively form the work function (WF) layers in the gate structures of the NMOS device and the PMOS device. That is, the WF layer in the gate structure of the NMOS device and the WF layer in the gate structure of the PMOS device are usually made of different metal materials. The WF layer in the NMOS device is known as an N-type WF layer and the WF layer in the PMOS device is known as a P-type WF layer. When the NMOS device shares a same gate electrode layer with the PMOS device, an N/P interface is usually formed between the N-type WF layer and the P-type WF layer at the interface between the NMOS device and the PMOS device. The WF materials on both sides of the N/P interface may diffuse into and interact with each other, resulting in changes in the performance of the NMOS device and the PMOS device.

For an SRAM device, the WF layer at the interface between the PU transistor and the PD transistor usually has a multiple-layer structure. Moreover, the WF layer at the interface includes both the N-type WF layer and the P-type WF layer so that the WF layer of the PU transistor may interacts with the WF of the PD transistor. For example, the WF layer of the PU transistor and the WF layer of the PD transistor may diffuse into each other along an in-plane transverse direction and thus may affect each other. Therefore, mismatch between the electrical parameters of the PU transistor and the PD transistor of the SRAM device may become more prominent, and thus may further affect the electrical performance of the SRAM device.

Further, the in-plane transverse diffusion is mainly diffusion of Al ions from the N-type WF material to the P-type WF material. Therefore, the equivalent WF values for the N-type WF layer and the P-type WF layer may be affected. The threshold voltages of the corresponding PU transistor and the corresponding PD transistor may be further affected.

When the type of the WF layer at the junction of the PU transistor and the PD transistor is relatively simple, the mutual diffusion and interaction between the WF layers at the interface between the PU transistor and the PD transistor may be effectively reduced such that the electrical performance of the SRAM device may be improved. In addition, the requirements on the read margin and the write margin may also be easily satisfied.

Figure 12:
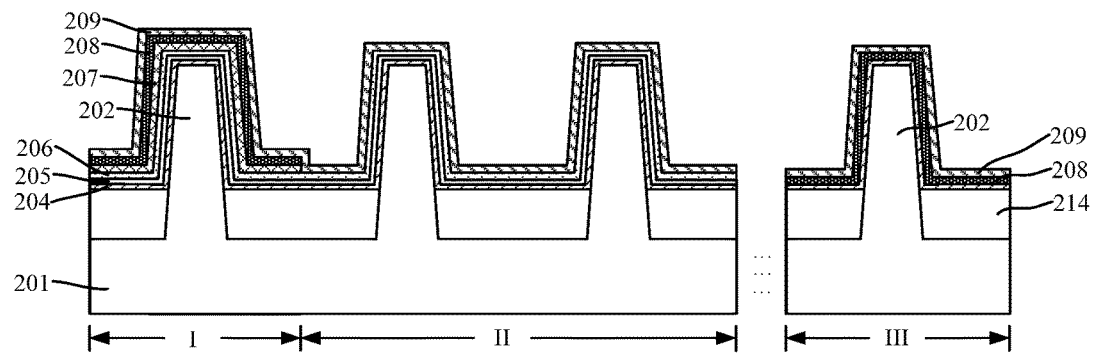
Figure 13:
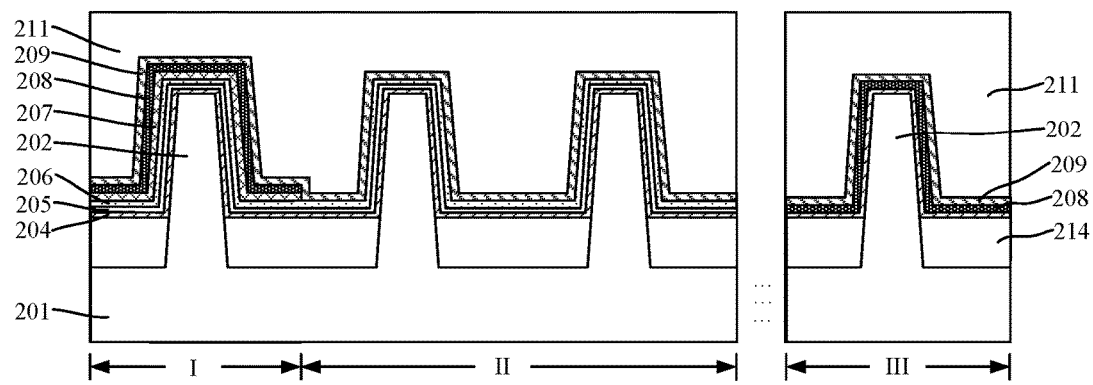
Figure 14:
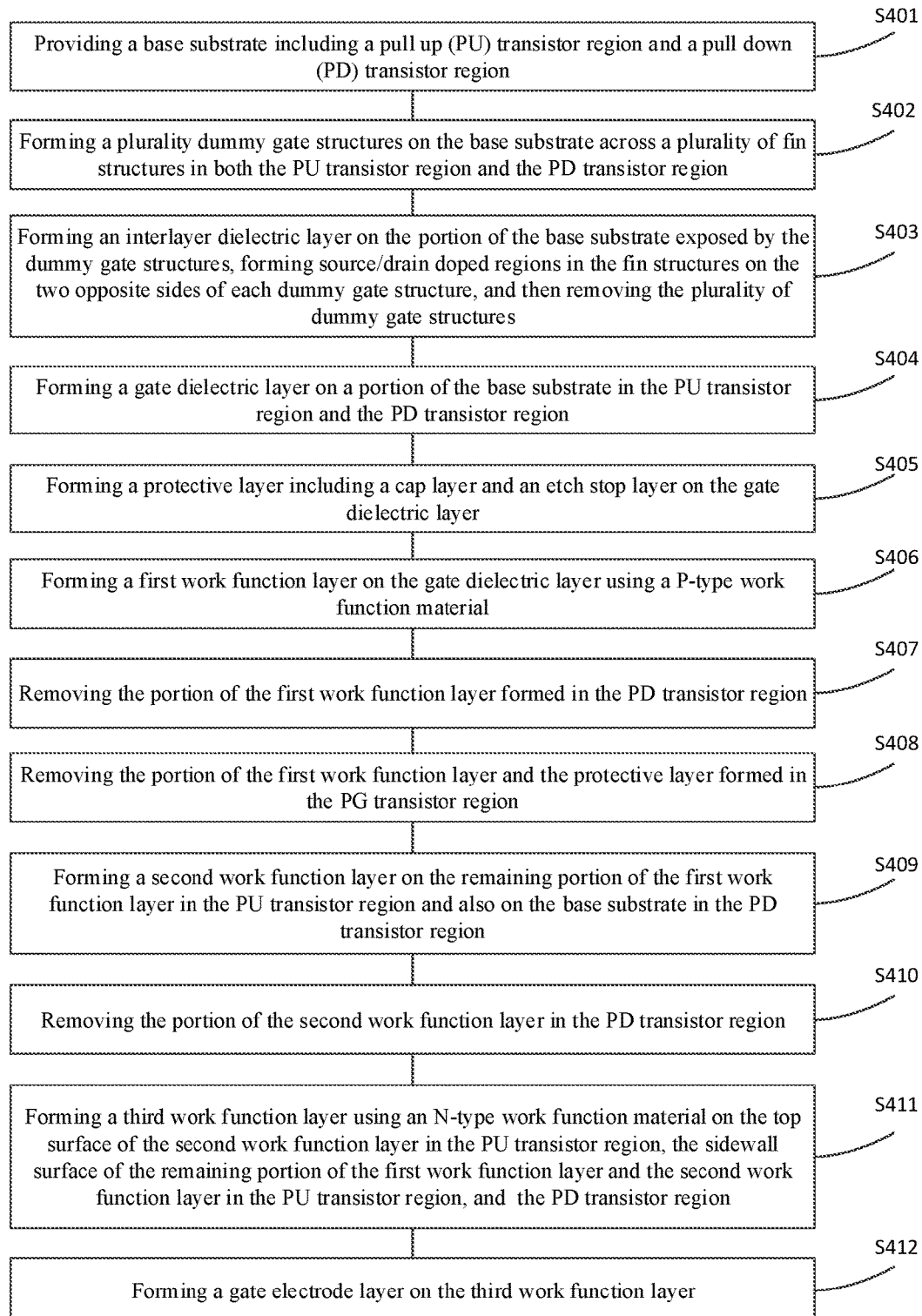
FIG. 14 illustrates a flowchart of an exemplary method for fabricating an SRAM device consistent with various disclosed embodiments in the present disclosure.

The present disclosure provides an SRAM device and a method for forming an SRAM device to improve the electrical performance. FIG. 14 shows a flowchart of an exemplary method for fabricating an SRAM device consistent with various disclosed embodiments in the present disclosure. FIGS. 2-13 illustrate schematic views of semiconductor structures at certain stages of the exemplary fabrication process consistent with various disclosed embodiments in the present disclosure.

Figure 2:
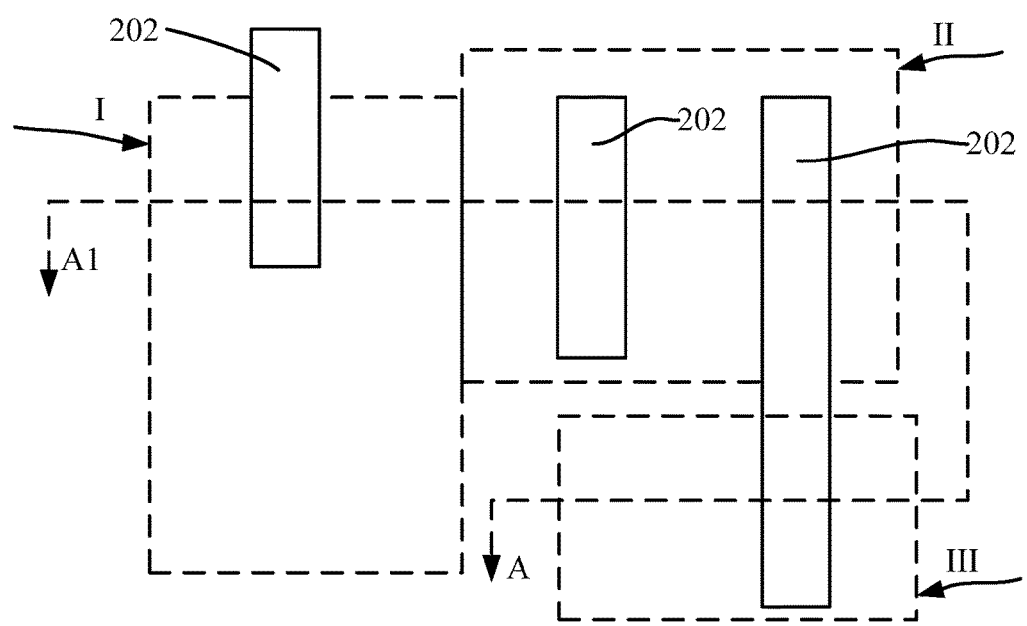
FIGS. 2-13 illustrate schematic views of semiconductor structures at certain stages for forming an exemplary SRAM device consistent with various disclosed embodiments in the present disclosure.
Figure 3:
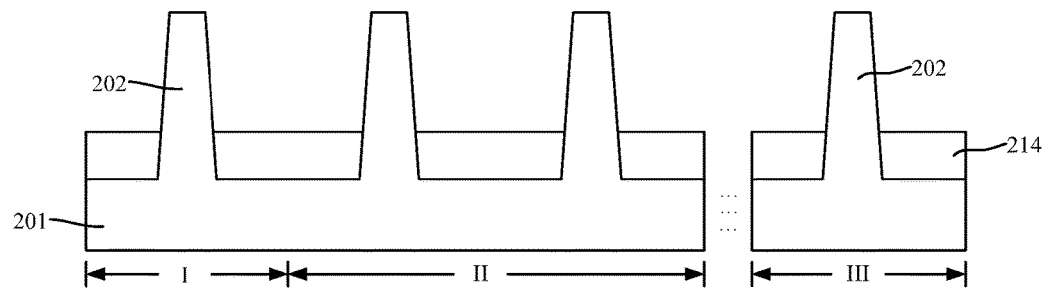

Referring to FIG. 14, at the beginning of the fabrication process, a base substrate may be provided (S401). FIG. 2 shows a schematic top view of a corresponding semiconductor structure. FIG. 3 shows a schematic cross-section view of the semiconductor structure shown in FIG. 2 along an AA1 line.

Referring to FIG. 2 and FIG. 3, a base substrate may be provided. The base substrate may include a PU transistor region I and a PD transistor region II. The PU transistor region I and the PD transistor region II may be adjacent to each other. In one embodiment, the base substrate may also include a PG transistor region III and an isolation structure to isolate electronic devices formed on the base substrate. The portion of the base substrate and the isolation structure between the PD transistor region II and the PG transistor region III may not be illustrated in FIG. 3.

The PU transistor region I may provide a process platform for subsequent formation of a PU transistor. The PD transistor region II may provide a process platform for subsequent formation of PU transistors.

In one embodiment, the PD transistor region II may include a first PD transistor region (not labeled) and a second PD transistor region (not labeled). The first PD transistor region may be located adjacent to the PU transistor region I. The first PD transistor region may provide a process platform for subsequent formation of a first PD transistor. The second PD transistor region may provide a process platform for subsequent formation of a second PD transistor. Further, the first PD transistor and the second PD transistor may be arranged in parallel with each other and may together serve as the PD transistors of the SRAM device.

The PG transistor region III may provide a process platform for subsequent formation of a PG transistor.

Further, the PU transistor region I may be a PMOS region, the PD transistor region II may be an NMOS region, and the PG transistor region may be an NMOS region.

In one embodiment, the SRAM device to be formed is a Fin-FET device. Accordingly, the base substrate may include a substrate 201 and a plurality of discrete fin structures 202 formed on the substrate 201. In order to electrically isolate neighboring fin structures 202 and thus neighboring devices from each other, the base substrate may also include an isolation structure 214 formed on the portion of the substrate 201 exposed between the plurality of fin structures 202. The isolation structure 214 may cover a portion of sidewall surfaces of each fin structure 202, and the top surface of the isolation structure 214 may be lower than the top surfaces of the fin structures 202.

The isolation structure 214 may be made of $SiO_x$, $SiN_x$, SiON, or any other appropriate material. In one embodiment, the isolation structure 214 is made of $SiO_x$.

In another embodiment, the SRAM device to be formed is a planar transistor device. Accordingly, the base substrate is a planar substrate. The planar substrate may be made of silicon, germanium, SiGe, SiC, silicon on insulator (SOI), germanium on insulator (GOI), glass, III-V group compound (such as GaN, GaAs, etc.), or any other appropriate material or structure. Moreover, gate structures may be subsequently formed on the surface of the planar substrate.

The substrate 201 may be made of silicon, germanium, SiGe, SiC, GaAs, InAs, etc. The substrate 201 may also be an SOI substrate or a GOI substrate. The plurality of fin structures 202 may be made of silicon, germanium, SiGe, SiC, GaAs, InAs, etc. In one embodiment, the substrate 201 is made of silicon, and the plurality of fins structures 202 are also made of silicon.

In one embodiment, the PD transistor region II includes a first PD transistor region and a second PD transistor region. Accordingly, the first PU transistor region I may include a fin structure 202, and the PD transistor region II may include two fin structures 202. In the PD transistor region II, one of the two fin structures 202 may provide a process platform for forming a first PD transistor, and the other fin structure 202 may provide a process platform for forming a second PD transistor. In addition, the PG transistor region III may include a fin structure 202. Moreover, the fin structure 202 in the PG transistor region III may extend into the PD transistor region II. That is, the PG transistor region III and the PD transistor region II may share the fin structure 202.

Further, in other embodiments, the number of the fin structures in the PU transistor region, the number of the fin structures in the PD transistor region, and the number of the fin structures formed in the PG transistor region may be varied as desired, based on different requirements of the properties of the SRAM device to be formed.

Further, in one embodiment, a high-k last and metal gate last process may be subsequently used to form a plurality of gate structures of the SRAM device. Therefore, the fabrication method may also include forming a plurality of dummy gate structures on the base substrate in both the PU transistor region and the PD transistor region.

Figure 4:
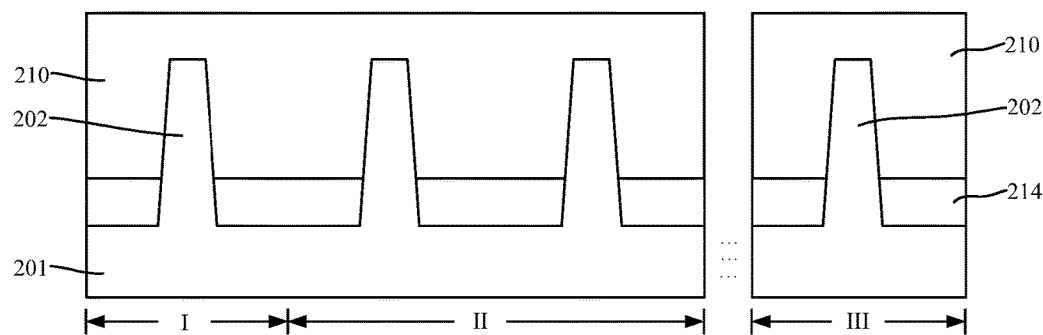

Referring to FIG. 14, a plurality of dummy gate structures may be formed on the base substrate across a plurality of fin structures in both the PU transistor region and the PD transistor region (S402). FIG. 4 shows a schematic cross-section view of a corresponding semiconductor structure.

Referring to FIG. 4, a plurality of dummy gate structures 210 may be formed on the base substrate in both the PU transistor region I and the PD transistor region II. The plurality dummy gate structures 210 may be formed to occupy spaces for a plurality of gate structures formed subsequently. Therefore, the plurality of dummy gate structures 210 may be formed on the isolation structure 214 across the fin structures 202. In addition, the plurality of dummy gate structures 210 may cover a portion of the top and the sidewall surfaces of each fin structure 202.

Each dummy gate structure 210 may have a single-layer structure or a multiple-layer structure. The dummy gate structure 210 may include a dummy gate layer or the dummy gate structure 210 may include a dummy oxide layer and a dummy gate layer formed on the dummy oxide layer. Further, the dummy gate layer may be made of polycrystalline silicon, $SiO_x$, $SiN_x$, SiON, SiC, SiCN, SiCON, or amorphous silicon. The dummy oxide layer may be made of $SiO_x$ or SiON.

In one embodiment, during the process to form the plurality of dummy gate structures 210 in the PU transistor region I and the PD transistor region II, the dummy gate structures 210 may also be formed in the PG transistor region III.

In one embodiment, because the PU transistor region I and the PD transistor region II are adjacent to each other, the dummy gate structure 210 may be formed across both the PU transistor region I and the PD transistor region II. Similarly, the subsequently-formed gate electrode layer may be formed across both the PU transistor region I and the PD transistor region II.

Further, referring to FIG. 14, after forming the dummy gate structures, the fabrication method may further include forming an interlayer dielectric layer on the portion of the base substrate exposed by the dummy gate structures, and then forming source/drain doped regions in the fin structures on the two opposite sides of each dummy gate structure (S403).

In one embodiment, after forming the plurality of dummy gate structures, the fabrication method may include forming an interlayer dielectric layer (not shown) on the portion of the base substrate exposed by the dummy gate structures. Further, the fabrication method may include forming source/drain doped regions in the fin structures 202 on the two opposite sides of each dummy gate structure 210.

After forming the plurality of source/drain doped regions, the plurality of dummy gate structures 210 may be removed. In one embodiment, the plurality of dummy gate structures 210 may be removed by a dry etching process, a wet etching process, or a SiCoNi etching process.

Figure 5:
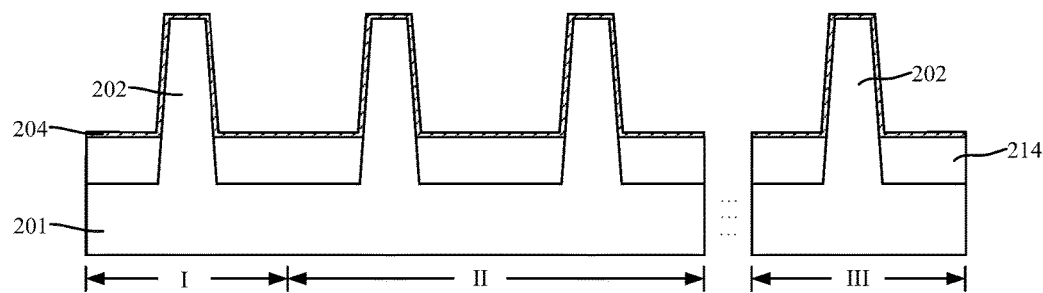

Further, returning to FIG. 14, after removing the plurality of dummy gate structures, a gate dielectric layer may be formed on a portion of the base substrate in the PU transistor region and the PD transistor region (S404). FIG. 5 shows a schematic cross-section view of a corresponding semiconductor structure.

Referring to FIG. 5, after removing the plurality of dummy gate structures 210 (referring to FIG. 4), a gate dielectric layer 204 may be formed on a portion of the base substrate in the PU transistor region I and the PD transistor region II.

In one embodiment, because the base substrate also includes a PG transistor region III, during the process to form the gate dielectric layer 204, the gate dielectric layer 204 may also be formed on a portion of the base substrate in the PG transistor region III.

Further, the gate dielectric layer 204 may include an interfacial layer (not shown) and a high-k gate dielectric layer (not shown) formed on the surface of the interfacial layer. For example, during the process to form the gate dielectric layer 204, the gate dielectric layer 204 may be formed across the fin structures 202 and cover a portion of the top and the sidewall surfaces of each fin structure 202.

The interfacial layer may provide a desired interface for forming the high-k gate dielectric layer such that the quality of the subsequently-formed high-k gate dielectric layer may be improved and the density of interface states between the high-k gate dielectric layer and the fin structure may be reduced. Specifically, the density of interface states due to direct contact between the high-k gate dielectric layer and the corresponding fin structure 202 may be avoided. The interfacial layer may be made of $SiO_x$ or SiON.

In one embodiment, the interfacial layer is formed only on the exposed portion of the top and the sidewall surfaces of each fin structure 202 through an oxidation process. In other embodiments, the interfacial layer may also be formed by a deposition process such as chemical vapor deposition (CVD), physical vapor deposition (PVD), atomic layer deposition (ALD), etc. In addition, the interfacial layer may also be formed on the isolation structure.

The high-k gate dielectric layer may be made of a dielectric material with a relative dielectric constant greater than the relative dielectric constant of $SiO_x$. In one embodiment, the high-k gate dielectric layer is made of $HfO_2$. In other embodiments, the high-k gate dielectric layer may also be made of one or more of HfSiO, HfSiON, HfTaO, HfTiO, HfZrO, $ZrO_2$, $Al_2O_3$, etc. Moreover, the high-k gate dielectric layer may be formed by a CVD, PVD, ALD process. For example, in one embodiment, the high-k gate dielectric layer is formed by an ALD process.

In a subsequent process, a WF layer may be formed on the gate dielectric layer 204. In order to provide protection for the gate dielectric layer 204 in the subsequent process, prior to forming a first WF layer, the fabrication process may also include forming a protective layer on the gate dielectric layer 204.

Figure 6:
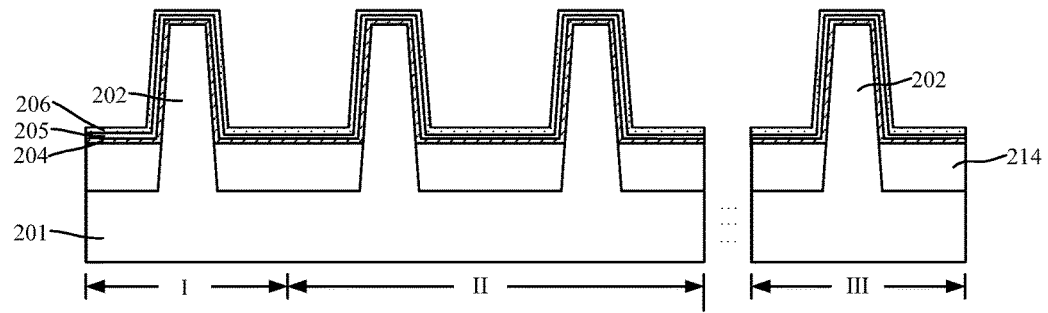

Further, returning to FIG. 14, a protective layer including a cap layer and an etch stop layer may be formed on the gate dielectric layer (S405). FIG. 6 shows a schematic cross-section view of a corresponding semiconductor structure.

Referring to FIG. 6, a protective layer (not labeled) including a cap layer 205 and an etch stop layer 206 may be formed on the gate dielectric layer 204. The process to form the protective layer may include the following steps. First, a cap layer 205 may be formed on the gate dielectric layer 204. Then, an etch stop layer 206 may be formed on the cap layer 205. The cap layer 205 and the etch stop layer 206 may together form the protective layer. Moreover, the etch stop layer 206 may be made of a material different from the material used to subsequently form the first WF layer.

In one embodiment, during the process to form the protective layer, the protective layer may also be formed on the portion of the gate dielectric layer 204 in the PG transistor region III.

The cap layer 205 may provide protection for the gate dielectric layer 204 and thus prevent undesired etching damage to the gate dielectric layer 204 during the subsequent etching process. The cap layer 205 may also be conducive to preventing the highly-diffusible metal ions in the subsequently-formed gate electrode layer from entering the gate dielectric layer 204.

In one embodiment, the cap layer 205 is made of TiN. Moreover, the cap layer 05 is formed by an ALD process such that the formed cap layer 205 may demonstrate desired step coverage capability.

The etch stop layer 206 and the subsequently-formed WF layer may be made of different materials such that a subsequently-performed etching process on the WF layer may have a relatively small etch rate on the etch stop layer 206. Therefore, during the subsequently-performed etching process on the WF layer, the etch stop layer 206 may be used to stop the etching effect and thus prevent etching damages to the gate dielectric layer 204.

In one embodiment, the etch stop layer 206 is made of TaN and formed by an ALD process. As such the formed etch stop layer 206 demonstrates desired step coverage capability.

Figure 7:
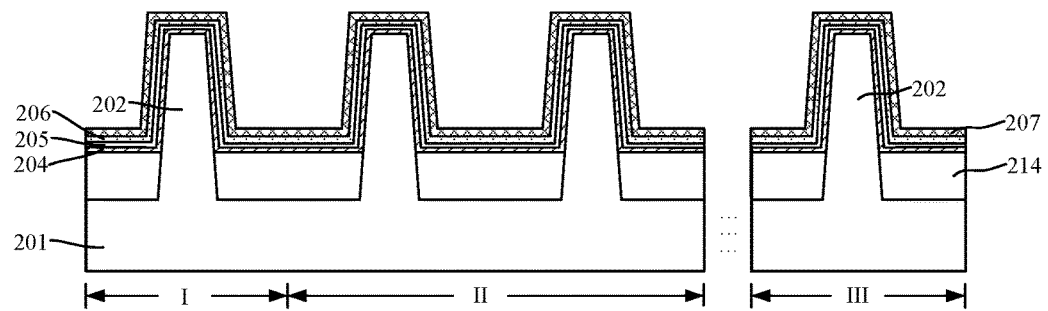

Further, returning to FIG. 14, a first work function layer, made of a P-type work function material, may be formed over the gate dielectric layer (S406). FIG. 7 shows a schematic cross-section view of a corresponding semiconductor structure.

Referring to FIG. 7, a first WF layer 207 may be formed on the gate dielectric layer 204. During the process to form the first WF layer 207, the first WF layer 207 may also be formed on the portion of the gate dielectric layer 204 in the PG transistor region III. In one embodiment, a protective layer is formed on the gate dielectric layer 204, and accordingly, the first WF layer 207 may be formed on the protective layer. Specifically, the first WF layer 207 may be formed on the etch stop layer 206. The first WF layer 207 may serve as a portion of the WF layer in the PU transistor region I.

The first WF layer 207 may be made of a P-type WF material. The WF value of the P-type WF material may be in a range of approximately 5.1 eV to 5.5 eV, such as 5.2 eV, 5.3 eV, 5.4 eV, etc. The first WF layer 207 may be made of one or more of Ta, TiN, TaN, TaSiN, TiSiN, etc. The first WF layer 207 may be formed by a CVD, PVD, ALD, or any other appropriate deposition process. In one embodiment, the first WF layer 207 is made of TiN, and the thickness of the first WF layer 207 is in a range of approximately 10 Å to 30 Å.

Figure 8:
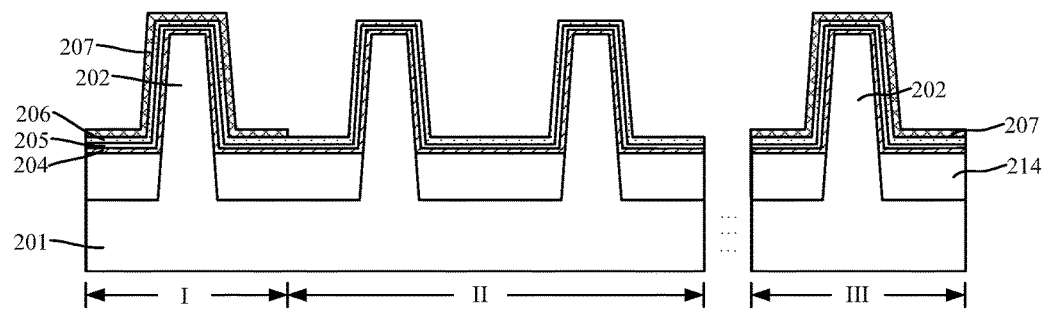

Returning to FIG. 14, further, the portion of the first work function layer formed in the PD transistor region may be removed (S407). FIG. 8 shows a schematic cross-section view of a corresponding semiconductor structure.

Referring to FIG. 8, the portion of the first WF layer 207 formed in the PD transistor region II may be removed by etching. Specifically, in one embodiment, in order to meet the requirements on the threshold voltage of each PD transistor, the portion of the first WF layer 207 formed in the PD transistor region II may need to be removed. In the meantime, the portion of the first WF layer 207 formed in the PU transistor region I may be retained to serve as a portion of the subsequently-formed WF layer of the PU transistor.

In one embodiment, the etching process to remove the portion of the first WF layer 207 formed in the PD transistor region II may include the following steps. First, a first patterned layer may be formed on the portion of the first WF layer 207 in the PU transistor region I and the PG transistor region III. The first patterned layer may expose the portion of the first WF layer 207 formed in the PD transistor region II and cover the portion of the first WF layer 207 formed in the PU transistor region I and the PG transistor region III. Further, the portion of the first WF layer 207 formed in the PD transistor region II may be removed by etching using the first patterned layer as an etch mask. Finally, the first patterned layer may be removed.

During the process to remove the portion of the first WF layer 207 formed in the PD transistor region II, the etch stop layer 206 formed in the PD transistor region II may serve as a layer to stop etching. As such, etching damages to the portion of the gate dielectric layer 204 formed in the PD transistor region II may be avoided.

Figure 9:
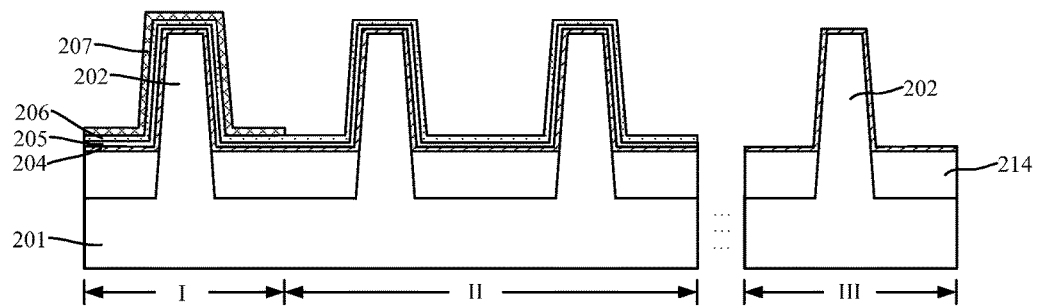

Further, returning to FIG. 14, the portion of the first work function layer and the protective layer formed in the PG transistor region may be removed (S408). FIG. 9 shows a schematic cross-section view of a corresponding semiconductor structure.

Referring to FIG. 9, the portion of the first WF layer 207 and the protective layer formed in the PG transistor region III may be removed. After removing the portion of the first WF layer 207 and the protective layer formed in the PG transistor region III, the portion of the gate dielectric layer 204 formed in the PG transistor region III may be exposed.

In one embodiment, removing the portion of the first WF layer 207 and the protective layer formed in the PG transistor region III to expose the gate dielectric layer 204 may have several benefits as described in the following.

First, because the portion of the first WF layer 207 and the protective layer formed in the PG transistor region III are removed through etching, the thickness of the subsequently-formed WF layer in the PG transistor region III may be small. Moreover, the PG transistor region III may be an NMOS region. That is, the transistor formed in the PG transistor region III may be an NMOS transistor. For the NMOS transistor formed in the PG transistor region III, the threshold voltage may be smaller when the thickness of the WF layer becomes smaller. Therefore, a relatively small thickness of the WF layer may be conducive to improving the operation speed of the subsequently formed PG transistor.

In one embodiment, the process to remove the portion of the first WF layer 207 and the protective layer formed in the PG transistor region III may include the following steps. First, a second patterned layer may be formed on the portion of the first WF layer 207 formed in the PU transistor region I and also on the protective layer formed in the PD transistor region II. The second patterned layer may expose the portion of the first WF layer 207 formed in the PG transistor region III. Further, the portion of the first WF layer 207, the etch stop layer 206, and the cap layer 205 formed in the PG transistor region III may be removed by etching using the second patterned layer as an etch mask. After the etching process, the gate dielectric layer 204 may be exposed in the PG transistor region III. Finally, the second patterned layer may be removed.

In one embodiment, the portion of the first WF layer 207 formed in the PD transistor region II may be removed before removing the portion of the first WF layer 207 and the protective layer formed in the PG transistor region III. In some other embodiments, the portion of the first WF layer and the protective layer formed in the PG transistor region may be removed before removing the portion of the first WF layer formed in the PD transistor region. Alternatively, the portion of the first WF layer formed in both the PD transistor region and the PG transistor region may be removed simultaneously and the portion of the protective layer formed in the PG transistor region may then be removed.

Figure 10:
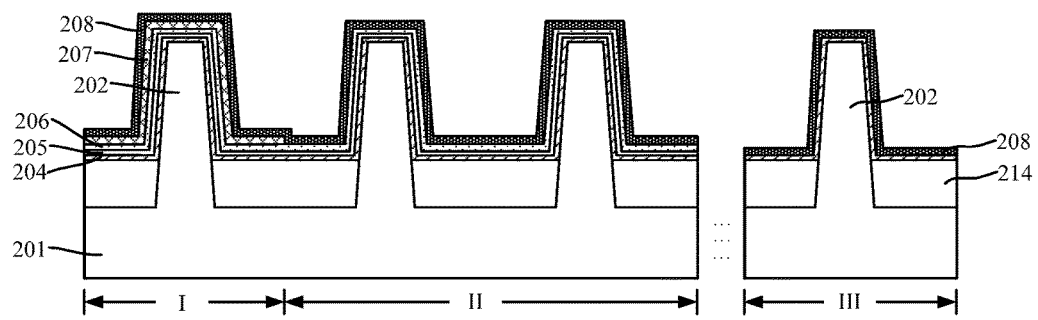

Further, returning to FIG. 14, a second work function layer made of a P-type WF material may be formed on the remaining portion of the first work function layer in the PU transistor region and also on the base substrate in the PD transistor region (S409). FIG. 10 shows a schematic cross-section view of a corresponding semiconductor structure.

Referring to FIG. 10, a second WF layer 208 may be formed on the remaining portion of the first WF layer 207 in the PU transistor region I. The second WF layer 208 may also be formed in the PD transistor region II. The second WF layer 208 may be made of a P-type WF material.

In one embodiment, during the process to form the second WF layer 208, the second WF layer 208 may also be formed on the portion of the protective layer in the PD transistor region II.

Moreover, during the formation process of the second WF layer 208, the second WF layer 208 may also be formed in the PG transistor region III. Specifically, during the process to form the second WF layer 208, the second WF layer 208 may also be formed on the portion of the gate dielectric layer 204 in the PG transistor region III.

In one embodiment, the portion of the second WF layer 208 formed in the PU transistor region I and the portion of the first WF layer 207 formed in the PU transistor region I may together serve as a WF layer in a subsequently-formed PU transistor. Moreover, the portion of the second WF layer 208 formed in the PG transistor region III may serve as a portion of the WF layer of the subsequently-formed PG transistor.

The second WF layer 208 may be made of one or more of Ta, TiN, TaN, TaSiN, TiSiN, and any other appropriate material. In one embodiment, the second WF layer 208 and the etch stop layer 206 may be made of different materials. In one embodiment, the second WF layer 208 is made of TiN, and the thickness of the second WF layer 208 may be in a range of approximately 5 Å to 30 Å.

Figure 11:
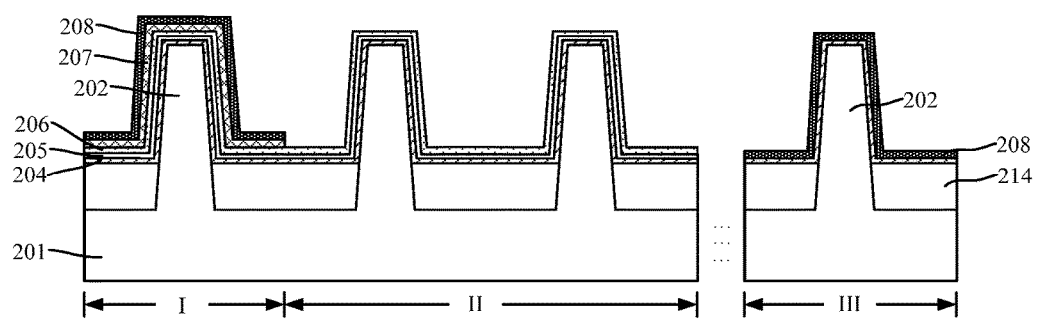

Further, returning to FIG. 14, the portion of the second WF layer formed in the PD transistor region may be removed (S410). FIG. 11 shows a schematic cross-section view of a corresponding semiconductor structure.

Referring to FIG. 11, the portion of the second WF layer 208 formed in the PD transistor region II may be removed by etching. Specifically, in order to meet the requirements on the threshold voltage of each PD transistor subsequently-formed in the PD transistor region II, the portion of the second WF layer 208 formed in the PD transistor region II may need to be removed.

In one embodiment, the process to remove the portion of the second WF layer 208 formed in the PD transistor region II may include the following steps. First, a third patterned layer may be formed on the second WF layer 208. The third patterned layer may expose the portion of the second WF layer 208 formed in the PD transistor region II. Further, the portion of the second WF layer 208 formed in the PD transistor region II may be removed by etching using the third patterned layer as an etch mask until the surface of the protective layer is exposed. Finally, the third patterned layer may be removed.

During the process to remove the portion of the second WF layer 208 formed in the PD transistor region II, the etch stop layer 206 in the PD transistor region II may serve as a layer to stop etching. As such, etching damages to the portion of the gate dielectric layer 204 formed in the PD transistor region II may be avoided. Moreover, the portion of the second WF layer 208 formed in the PG transistor region III may not be removed.

In one embodiment, after removing the portion of the second WF layer 208 formed in the PD transistor region II, the remaining portion of the first WF layer 207 and the remaining portion of the second WF layer 208 may have coplanar sidewall surfaces at the interface between the PU transistor region I and the PD transistor region II.

Further, returning to FIG. 14, a third work function layer may be formed on the top surface of the second work function layer in the PU transistor region, the sidewall surface of the remaining portion of the first work function layer and the second work function layer in the PU transistor region, and the PD transistor region (S411). FIG. 12 shows a schematic cross-section view of a corresponding semiconductor structure.

Referring to FIG. 12, a third WF layer 209 may be formed on the top surface of the second WF layer 208 in the PU transistor region I and also on the sidewall surface of the remaining portion of the second WF layer 208 and the first WF layer 207 in the PU transistor region I. In addition, the third WF layer 209 may also be formed on the PD transistor region II. The third WF layer 209 may be made of an N-type WF material.

In one embodiment, during the process to form the third WF layer 209, the third WF layer 209 may be formed on the portion of protective layer formed in the PD transistor region II. Moreover, during the process to form the third WF layer 209, the third WF layer 209 may also be formed on in the PG transistor region III. For example, the third WF layer 209 may be formed on the portion of the second work function layer 208 in the PG transistor region III.

The portion of the third WF layer 209 formed in the PD transistor region II may serve as a WF layer in the PD transistor region II to adjust the threshold voltage of a subsequently-formed PD transistor. The portion of the third WF layer 209 and the second WF layer 208 formed in the PG transistor region III may together serve as a WF layer in the PG transistor region III to adjust the threshold voltage of a subsequently-formed PG transistor.

The portion of the first WF layer 207 and the second WF layer 208 formed in the PU transistor region I may serve as a WF layer in the PU transistor region I to adjust the threshold voltage of a subsequently-formed PU transistor.

In one embodiment, to simplify the process and reduce the frequency of using masks, after forming the third WF layer 209, the portion of the third WF layer 209 formed in the PU transistor region I may be retained. In other embodiments, after forming the third WF layer, the portion of the third WF layer formed in the PU transistor region may be removed by an etching process.

The third WF layer 209 may be made of an N-type WF layer. The N-type WF layer may have a WF in a range from 3.9 eV to 4.5 eV, such as 4 eV, 4.1 eV, 4.3 eV, etc. For example, the third WF layer 209 may be made of one or more of TiAl, TiAlC, TaAlN, TiAlN, TaCN, AlN, etc. The third WF layer 209 may be formed through a CVD, PVD, ALD, or any other appropriate deposition process. In one embodiment, the third WF layer 209 is made of TiAl.

The thickness of the third WF layer 209 may be determined based on the threshold voltages of the PU transistor and the PG transistor to be subsequently formed. In one embodiment, the thickness of the third WF layer 209 is in a range of approximately 20 Å to 70 Å.

Further, returning to FIG. 14, a gate electrode layer may be formed on the third work function layer (S412). FIG. 13 shows a schematic cross-section view of a corresponding semiconductor structure.

Referring to FIG. 13, a gate electrode layer 211 may be formed on the third WF layer 209. In one embodiment, the gate electrode layer 211 may be formed on the third WF layer 209 in the PU transistor region I, the PD transistor region II, and the PG transistor region III. The portion of the gate electrode layer 211 formed in the PU transistor region I and the PD transistor region II may be formed across both the PU transistor region I and the PD transistor region II. The structure may be equivalently considered as the PU transistor region I and the PD transistor region sharing a common gate electrode layer 211.

In one embodiment, the gate electrode layer 211 may be made of one or more of Al, Cu, Ag, Au, Pt, Ni, Ti, W, etc.

In one embodiment, the process to form the gate electrode layer 211 may include the following steps. First, a gate electrode film may be formed on the third WF layer 209. The top surface of the gate electrode film may be higher than the top surface of the interlayer dielectric layer (not shown). Further, the portion of the gate electrode film formed above the top surface of the interlayer dielectric layer may be removed through polishing to form the gate electrode layer 211.

According to the disclosed fabrication methods for SRAM devices, the PU transistor region I and the PD transistor region II may be adjacent to each other. In addition, the first WF layer 207 and the second WF layer 208 may only be formed in the PU transistor region I. Moreover, the WF layer formed in the PU transistor region I may have a simple structure and the WF layer formed in the PD transistor region II may also have a simple structure. Therefore, the interface of the WF layers at the interface between the PU transistor region I and the PD transistor region II may be formed between the sidewall of the first WF layer 207 and the sidewall of the third WF layer 209 and also between the sidewall of the second WF layer 208 and the sidewall of the third WF layer 209. As such, the interface of the WF layers at the interface of the PU transistor region I and the PD transistor region II may be simple so that inter-diffusion of the WF layers at the interface may be effectively avoided. Therefore, the electrical performance of the formed SRAM device may be improved. For example, the electrical parameter mismatch between the PU transistor and the PD transistor may be reduced.

Specifically, the inter-diffusion of the WF layers at the interface may mainly include inter-diffusion of the ions between the first WF layer 207 and the third WF layer 209 and inter-diffusion of the ions between the second WF layer 208 and the third WF layer 209. The inter-diffusion of the ions between the first WF layer 207 and the third WF layer 209 may affect the material properties of the first WF layer 207 and the third WF layer 209 such that the equivalent WF values of the first WF layer 207 and the third WF layer 209 may be changed. Moreover, the inter-diffusion of the ions between the second WF layer 208 and the third WF layer 209 may affect the material properties of the second WF layer 208 and the third WF layer 209 such that the equivalent WF values of the second WF layer 208 and the third WF layer 209 may be changed. Therefore, the inter-diffusion of the WF layers at the interface may affect the threshold voltages of the subsequently-formed PU transistor and PD transistor. Moreover, the inter-diffusion of the WF layers at the interface may substantially include diffusion of Al ions from the third WF layer 209 to the first WF layer 207 or the second WF layer 208.

In one embodiment, the sidewall of the first WF layer 207 and the sidewall of the second WF layer 208 may have coplanar sidewall surfaces at the interface between the PU transistor region I and the PD transistor region II. As such, it may further help simplify the interface of the WF layers at the interface between the PU transistor region I and the PD transistor region II, and also suppress the inter-diffusion of the WF layers at the interface. Therefore, the performance of the formed SRAM device may be further improved.

In addition, the formed SRAM device may also meet the requirements for read margin and write margin.

Further, the present disclosure also provides an SRAM device. FIG. 13 illustrates a schematic cross-section view of an exemplary SRAM device consistent with various embodiments of the present disclosure.

Referring to FIG. 13, the SRAM device may include a base substrate (not labeled) including a PU transistor region I and a PD transistor region II, a gate dielectric layer 204 formed on a portion of the base substrate in both the PU transistor region I and the PD transistor region II, a first WF layer 207 formed on the portion of the gate dielectric layer 204 formed in the PU transistor region I, and a second WF layer 208 formed on the first WF layer 207. Each of the first WF layer 207 and the second WF layer 208 may be made of a P-type WF material.

Moreover, the SRAM device may include a third WF layer 209 formed on the portion of the gate dielectric layer 204 formed in the PD transistor region II. The third WF layer 209 may also be formed on the top and the sidewall surfaces of the second WF layer 208 in the PU transistor region I, and may also cover the sidewall surface of the first WF layer 207 in the PU transistor region I. The third WF layer 209 may be made of an N-type WF material.

Further, the SRAM device may also include a gate electrode layer 211 formed on the third WF layer 209.

In one embodiment, the PD transistor region II may further include a first PD transistor region (not labeled) and a second PD transistor region (not labeled). The first PD transistor region and the second PD transistor region may be adjacent to each other. The first PD transistor region may include a first PD transistor, and the second PD transistor region may include a second PD transistor.

Moreover, the base substrate may further include a PG transistor region III. Accordingly, the gate dielectric layer 204 may also be formed on the portion of the base substrate in the PG transistor region III. The second WF layer 208 may also be formed on the portion of the gate dielectric layer 204 in the PG transistor region III. In addition, the third WF layer 209 may also be formed on the portion of the second WF layer 208 in the PG transistor region III.

In one embodiment, the SRAM device may be a Fin-FET device. Accordingly, the base substrate of the SRAM device may include a substrate 201 and a plurality of discrete fin structures 202 formed on the substrate 201. The base substrate may also include an isolation structure 214 formed on the portion of the substrate 201 exposed by the fin structures 202. The isolation structure 214 may cover a portion of the sidewall surfaces of the fin structures 202, and the top surface of the isolation structure 214 may be lower than the top surfaces of the fin structures 202.

In one embodiment, the PU transistor region I may include one fin structure 202, and the PD transistor region II may include two fin structures 202. Specifically, one of the two fin structures 202 in the PD transistor region II may provide a process platform for the first PD transistor region, while the other one of the two fin structures 202 in the PD transistor region II may provide a process platform for the second PD transistor region. Moreover, the PG transistor region may include one fin structure 202.

The detailed arrangement of the base substrate and the gate dielectric layer 204 may be referred to the corresponding description in the previous embodiment.

Moreover, the first WF layer 207 may be made of one or more of Ta, TiN, TaN, TaSiN, TiSiN, etc., the second WF layer 208 may be made of one or more of Ta, TiN, TaN, TaSiN, TiSiN, etc., and the third WF layer 209 may be made of one or more of TiAl, TiAlC, TaAlN, TiAlN, TaCN, AlN, etc.

In one embodiment, the first WF layer 207 may be made of TiN, the second WF layer 208 may be made of TiN, and the third WF layer 209 may be made of TiAl.

In one embodiment, the thickness of the first WF layer 207 may be in a range of approximately 10 Å to 30 Å, the thickness of the second WF layer 208 may be in a range of approximately 5 Å to 30 Å, and the thickness of the third WF layer 209 may be in a range of approximately 20 Å to 70 Å.

The SRAM device may also include a protective layer formed in the PU transistor region I between the gate dielectric layer 204 and the first work function layer 207. The protective layer may also be formed in the PD transistor region II between the gate dielectric layer 204 and the third WF layer 209.

The protective layer may provide protection for the gate dielectric layer 204. In one embodiment, the protective layer may further include a cap layer 205 formed on the gate dielectric layer 204 and an etch stop layer 206 formed on the cap layer 205. The cap layer 205 may be made of TiN, and the etch stop layer 206 may be made of TaN.

According to the disclosed SRAM devices, the PU transistor region I and the PD transistor region II may be adjacent to each other. In addition, the first WF layer 207 and the second WF layer 208 may only be formed in the PU transistor region I. Moreover, the WF layer formed in the PU transistor region I may have a simple structure and the WF layer formed in the PD transistor region II may also have a simple structure. Therefore, the interface of the WF layers at the interface between the PU transistor region I and the PD transistor region II may be formed between the sidewall of the first WF layer 207 and the sidewall of the third WF layer 209 and also between the sidewall of the second WF layer 208 and the sidewall of the third WF layer 209. As such, the interface of the WF layers at the interface of the PU transistor region I and the PD transistor region II may be simple so that inter-diffusion of the WF layers at the interface may be effectively avoided. Therefore, the electrical performance of the formed SRAM device may be improved. For example, the electrical parameter mismatch between the PU transistor and the PD transistor may be reduced.

In one embodiment, the sidewall of the first WF layer 207 and the sidewall of the second WF layer 208 may have coplanar sidewall surfaces at the interface between the PU transistor region I and the PD transistor region II. As such, it may further help suppress the inter-diffusion of the WF layers at the interface. Therefore, the electrical performance of the formed SRAM device may be further improved.

Compared to existing fabrication methods and SRAM devices, the disclosed fabrication methods and SRAM devices may demonstrate several advantages.

For example, according to the disclosed SRAM device and fabrication method, after forming the first WF layer on the portion of the gate dielectric layer in the PU transistor region and the PD transistor region, the portion of the first WF layer formed in the PD transistor region may be removed. A second WF layer may then be formed on the remaining portion of the first WF layer in the PU transistor region and also on the gate dielectric layer in the PD transistor region. The first WF layer and the second WF layer may be made of P-type WF materials. Further, the portion of the second WF layer formed in the PD transistor region may be removed, and a third WF layer may then be formed on the top surface of the second WF layer formed in the PU transistor region, the sidewall surfaces of the first WF layer and the second WF layer formed in the PU transistor region, and the top surface of the gate dielectric layer formed in the PD transistor region. The third WF layer may be made of an N-type WF material. A gate electrode layer may be formed on the third WF layer. The disclosed SRAM devices and fabrication methods may meet the requirements on the threshold voltages of both the PU transistor and the PD transistor, and in the meantime, may ensure simple structures for the WF layers in the PU transistor region and the PD transistor region, avoiding a complex interface of WF layers at the interface between the PU transistor region and the PD transistor region. Therefore, the disclosed SRAM device and fabrication method may effectively suppress the inter-diffusion of the WF layers at the interface, and thus the electrical parameter mismatch between the PU transistor and the PD transistor may be reduced and the electrical performance of the formed SRAM device may be improved.

In certain embodiments, the base substrate of the disclosed SRAM devices may also include a PG transistor region. Accordingly, prior to the formation of the second WF layer, the portion of the first WF layer and the protective layer formed in the PG transistor region may be removed to ensure a relatively thin WF layer in the PG transistor region. Therefore, the threshold voltage of the formed PG transistor may be relatively low such that the operation speed of the PG transistor may be improved. As such, the electrical performance of the formed SRAM devices may be further improved.

According to the disclosed SRAM device, the PU transistor region and the PD transistor region may be adjacent to each other. In addition, the first WF layer and the second WF layer may only be formed in the PU transistor region. Moreover, the WF layer formed in the PU transistor region may have a simple structure and the WF layer formed in the PD transistor region may also have a simple structure. Therefore, the interface of the WF layers at the interface between the PU transistor region and the PD transistor region may be formed between the sidewall of the first WF layer and the sidewall of the third WF layer and also between the sidewall of the second WF layer and the sidewall of the third WF layer. As such, the interface of the WF layers at the interface of the PU transistor region and the PD transistor region may be simple so that inter-diffusion of the WF layers at the interface may be effectively avoided. Therefore, the electrical performance of the formed SRAM device may be improved. For example, the electrical parameter mismatch between the PU transistor and the PD transistor may be reduced.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a static random-access memory (SRAM) device, comprising:
   providing a base substrate including a pull up (PU) transistor region and a pull down (PD) transistor region adjacent to the PU transistor region;
   forming a gate dielectric layer on a portion of the base substrate in the PU transistor region and the PD transistor region;
   forming a first work function (WF) layer using a P-type WF material on the gate dielectric layer;
   removing a portion of the first WF layer formed in the PD transistor region;
   forming a second WF layer using a P-type WF material on a remaining portion of the first WF layer in the PU transistor region and on the gate dielectric layer in the PD transistor region;
   removing a portion of the second WF layer formed in the PD transistor region;
   forming a third WF layer using an N-type WF material on a top surface and a sidewall surface of a remaining portion of the second WF layer in the PU transistor region, a sidewall surface of the remaining portion of the first WF layer in the PU transistor region, and the gate dielectric layer in the PD transistor region; and
   forming a gate electrode layer on the third WF layer.

2. The method for fabricating the SRAM device according to claim 1, wherein:
   after removing the portion of the second WF layer formed in the PD transistor region by etching, the sidewall surface of the remaining portion of the first WF layer and the sidewall surface of the remaining portion of the second WF layer are coplanar with each other at an interface between the PU transistor region and the PD transistor region.

3. The method for fabricating the SRAM device according to claim 1, wherein:
   the first WF layer is made of at least one of Ta, TiN, TaN, TaSiN, and TiSiN;
   the second WF layer is made of at least one of Ta, TiN, TaN, TaSiN, and TiSiN; and
   the third WF layer is made of at least one of TiAl, TiAlC, TaAlN, TiAlN, TaCN, and AlN.

4. The method for fabricating the SRAM device according to claim 1, wherein:
   a thickness of the first WF layer is in a range of approximately 10 Å to 30 Å;
   a thickness of the second WF layer is in a range of approximately 5 Å to 30 Å; and
   a thickness of the third WF layer is in a range of approximately 20 Å to 70 Å.

5. The method for fabricating the SRAM device according to claim 1, after forming the gate dielectric layer and prior to forming the first WF layer, further including:
   forming a protective layer on the gate dielectric layer.

6. The method for fabricating the SRAM device according to claim 5, wherein forming the protective layer on the gate dielectric layer includes:
   forming a cap layer on the gate dielectric layer;
   forming an etch stop layer on the cap layer using a material different from the first WF layer; and
   the cap layer and the etch stop layer together form the protective layer.

7. The method for fabricating the SRAM device according to claim 6, wherein:
   the cap layer is made of TiN; and
   the etch stop layer is made of TaN.

8. The method for fabricating the SRAM device according to claim 5, wherein:
   when forming the third WF layer, the third WF layer is also formed on the protective layer in the PD transistor region.

9. The method for fabricating the SRAM device according to claim 5, wherein the base substrate also includes a pass gate (PG) transistor region, and:
   when forming the gate dielectric layer and the protective layer, the gate dielectric layer and the protective layer are also formed on a portion of the base substrate in the PG transistor region;
   when forming the first WF layer, the first WF layer is also formed on the PG transistor region;
   when forming the second WF layer, the second WF layer is also formed on the PG transistor region; and
   when forming the third WF layer, the third WF layer is also formed on the PG transistor region.

10. The method for fabricating the SRAM device according to claim 9, wherein:
    prior to forming the second WF layer, a portion of the first WF layer and the protective layer formed in the PG transistor region is removed; and
    when forming the second WF layer, the second WF layer formed in the PG transistor region is on the gate dielectric layer.

11. The method for fabricating the SRAM device according to claim 10, wherein:
    the portion of the first WF layer and the protective layer formed in the PG transistor region are removed after removing the portion of the first WF formed in the PD transistor region.

12. The method for fabricating the SRAM device according to claim 1, wherein:
    the gate dielectric layer includes an interfacial layer and a high-k gate dielectric layer formed on the interfacial layer.

13. The method for fabricating the SRAM device according to claim 1, wherein:

the PD transistor region includes a first PD transistor region and a second PD transistor region, with the first PD transistor region adjacent to the PU transistor region.

\* \* \* \* \*